United States Patent
Inomoto et al.

(10) Patent No.: US 6,391,671 B2
(45) Date of Patent: May 21, 2002

(54) METHOD OF PRODUCING AN OPTICAL SEMICONDUCTOR DEVICE HAVING A WAVEGUIDE LAYER BURIED IN AN INP CURRENT BLOCKING LAYER

(75) Inventors: Yasumasa Inomoto; Yasutaka Sakata, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/756,117

(22) Filed: Jan. 9, 2001

Related U.S. Application Data

(62) Division of application No. 09/080,516, filed on May 18, 1998, now Pat. No. 6,222,867.

(30) Foreign Application Priority Data

May 16, 1997 (JP) ............................................. 9-126964

(51) Int. Cl.[7] ............................................. H01L 21/00
(52) U.S. Cl. .............................. 438/41; 438/32; 438/39
(58) Field of Search .............................. 438/24, 31, 32, 438/39, 41

(56) References Cited

U.S. PATENT DOCUMENTS

| | | | |
|---|---|---|---|
| 5,250,462 A | * 10/1993 | Sasaki et al. | .................. 438/24 |
| 5,539,763 A | 7/1996 | Takemi et al. | |
| 5,548,607 A | 8/1996 | Tsang | |
| 5,717,710 A | 2/1998 | Miyazaki et al. | |

FOREIGN PATENT DOCUMENTS

| | | |
|---|---|---|
| JP | 62-102583 | 5/1987 |
| JP | 8-330665 | 12/1996 |

OTHER PUBLICATIONS

Sakata, et al. "Novel MQW–DCPBH–LDs fabricated by all selective MOVPE laser diodes (ASM–DCPBH–LDs)," Papers of 56th Japanese Science Lecture Meeting, 1995, 27p–ZA–7, p. 930.
Proceedings of the 1997 IEICE General Conference; Mar. 24–27, 1997, Kansai University, Suita, p. 420.
Electronics Letter, an International Publication; The Institution of Electrical Engineers; Jan. 16, 1992; vol. 28, No. 2, pp. 153–154.
Moerman et al, "Monolithic Integration of a Spot Size Transformer with a Planar Buried Heterostructure InGaAsP/InP Laser Using the Shadow Masked Growth Technique", IEEE Photonics Technology Letters, vol. 6, No. 9, pp. 88–890.
Kobayashi et al, "Tapered Thickness MQW Waveguide BH MQW Lasers", IEEE Photonics Technology Letters, vol. 6, No. 9, pp. 1080–1081.
Tohmori et al, "Spot–size Converted 1.3 um Laser with Butt–Jointed Selectively Grown Vertically Tapered Waveguide", Electronics Letters, vol. 31, No. 13, pp. 1069–1070.

* cited by examiner

Primary Examiner—Kevin M. Picardat
(74) Attorney, Agent, or Firm—Foley & Lardner

(57) ABSTRACT

An integrated semiconductor laser produced by forming waveguide layers each having a particular band gap and a particular layer thickness collectively and then forming an InP current blocking layer. After an InGaAsP layer has been formed on an InP substrate, a waveguide including a multiple quantum well active layer is formed by selective MOVPE. Then, the waveguide is buried in an InP current blocking layer. In this configuration, the current blocking layer exhibits its expected function without regard to the width of $SiO_2$ stripes used for selective metalorganic vapor phase epitaxial growth (MOVPE). The laser is feasible for high output operation and can be produced at a high yield.

13 Claims, 3 Drawing Sheets

METHOD OF PRODUCING AN OPTICAL SEMICONDUCTOR DEVICE HAVING A WAVEGUIDE LAYER BURIED IN AN INP CURRENT BLOCKING LAYER

This application is a divisional of application Ser. No. 09/080,516, filed May 18, 1998, now U.S. Pat. No. 6,222,867.

BACKGROUND OF THE INVENTION

The present invention relates to an optical semiconductor device and a method of producing the same and, more particularly, to an integrated semiconductor device feasible for high temperature or high optical output operation because of an amount of current leak to occur from its current blocking layer, and a method of producing the same.

Today, the applicable range of optical communication is extending from trunk lines to branch lines or even to access lines. Semiconductor lasers for optical communication are therefore required to have advanced performance and new functions. For a trunk line, for example, a semiconductor laser whose drive spectrum involves a minimum of jitter at the time of modulation is essential in order to implement high speed, long distance transmission. A distributed feedback (DFB) laser having an electro absorption type optical modulator integrated therewith is one type of semiconductor laser meeting the above requirement. As for an access line, there is an increasing demand for a semiconductor laser to be easy to mount and capable of being efficiently coupled to an optical fiber. This kind of laser may be typified by a so-called spot size conversion type laser including a portion for converting the size of a beam.

Japanese Patent Laid-Open Publication No. 62-102583, for example, teaches a semiconductor laser desirable in high temperature or high optical output characteristic. However, the problem with the laser taught in this document is that the characteristic and yield are limited for the following reasons. To form layers different in band gap and thickness on a single substrate, crystal growth and crystal etching must be repeated, increasing the number of steps. Moreover, it is difficult to connect waveguides different in band gap and thickness accurately. As a result, a light loss occurs at the connecting portion and deteriorates the optical output characteristic.

To implement an integrated semiconductor laser, selective metalorganic vapor phase epitaxial growth (MOVPE) procedure capable of forming waveguide layers different in band gap and thickness collectively is attracting increasing attention. A semiconductor laser produce by selective MOVPE is disclosed in, e.g., the Papers of 56th Japanese Science Lecture Meeting, 1995, 27p-ZA-7, p. 930. This kind of scheme, however, brings about a problem that a current blocking layer included in the laser cannot function sufficiently in a high temperature environment or on the injection of a great current. Specifically, while a laser portion usually has the smallest band gap, it is necessary with selective MOVPE to increase the width of an anti-growth mask in the waveguide portion where the band gap should be reduced, i.e., the laser portion. It follows that in the laser portion the current blocking layer implemented only by InP and having a p-n-p-n thyristor structure has a broad area at both sides of an active layer. As a result, current leakage from the current blocking layer and ascribable to the storage of electrons is aggravated.

SUMMARY OF THE INVENTION

It is therefore an object of the present invention to provide an integrated semiconductor laser feasible for high temperature or high output operation, and a method of producing the same.

In accordance with the present invention, in an optical semiconductor device having an electro absorption type modulator and a DFB laser in an integrated structure, the modulator and laser are formed on an InP substrate formed with an InGaAsP layer, and waveguide layers respectively functioning as the modulator and laser are buried in an InP current blocking layer.

Also, in accordance with the present invention, in an optical semiconductor device including a laser having a spot size converting portion integrally therewith, the laser is formed on an InP substrate formed with an InGaAsP layer, and waveguide layers respectively functioning as the laser and spot size converting portion are buried in an InP current blocking layer.

Further, in accordance with the present invention, a method of producing a semiconductor device has the steps of forming two $SiO_2$ stripes on an InP substrate formed with an InGaAsP layer, and forming a waveguide including a multiple quantum well active layer by selective MOVPE between the two stripes, and burying the waveguide in an InP current blocking layer.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENTS

Figure 1:
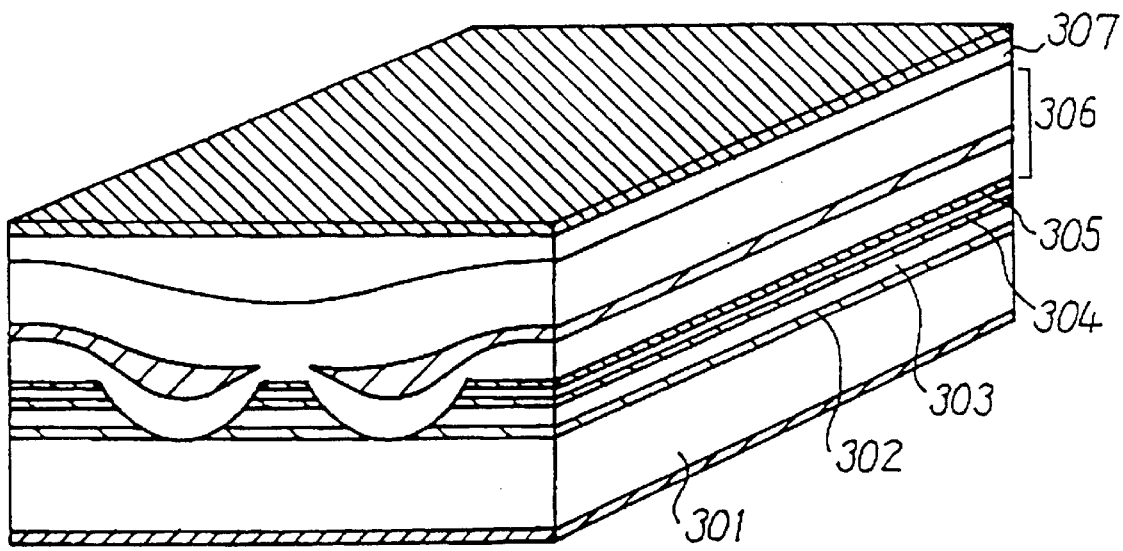
FIG. 1 shows a conventional semiconductor laser having an improved high temperature or high optical output characteristic.

To better understand the present invention, brief reference will be made to a conventional semiconductor laser featuring an improved high temperature or high optical output characteristic, shown in FIG. 1. The laser to be described is taught in Japanese Patent Laid-Open Publication No. 62-102583 mentioned earlier. As shown, the laser includes a (100)n-InP substrate 301. An n-InGaAsP carrier recombination layer 302, an n-InP cladding layer 303, an InGaAsP active layer 304 and a p-InP cladding layer 305 are sequentially formed on the substrate 301 by liquid phase epitaxial growth (LPE hereinafter). Two parallel grooves reaching the recombination layer 302 are formed in a <011> direction, implementing a mesa stripe. Subsequently, a p-InP/n-InP/p-InP current blocking layer 306 having a thyristor structure and a p-InGaAsP cap layer 307 are formed by LPE.

The current blocking layer 306 includes a carrier recombination layer implemented by InGaAsP having a smaller band gap than InP. With the blocking layer 306, the semiconductor laser restricts the storage of electrons in the n-InP blocking layer during high temperature operation or high optical output operation. This successfully obviates the turn-on of the current blocking layer 306 having the p-n-p-n thyristor structure. However, the configuration shown in FIG. 1 results in limited yield and limited optical output characteristic for the reasons discussed earlier.

Figure 2:
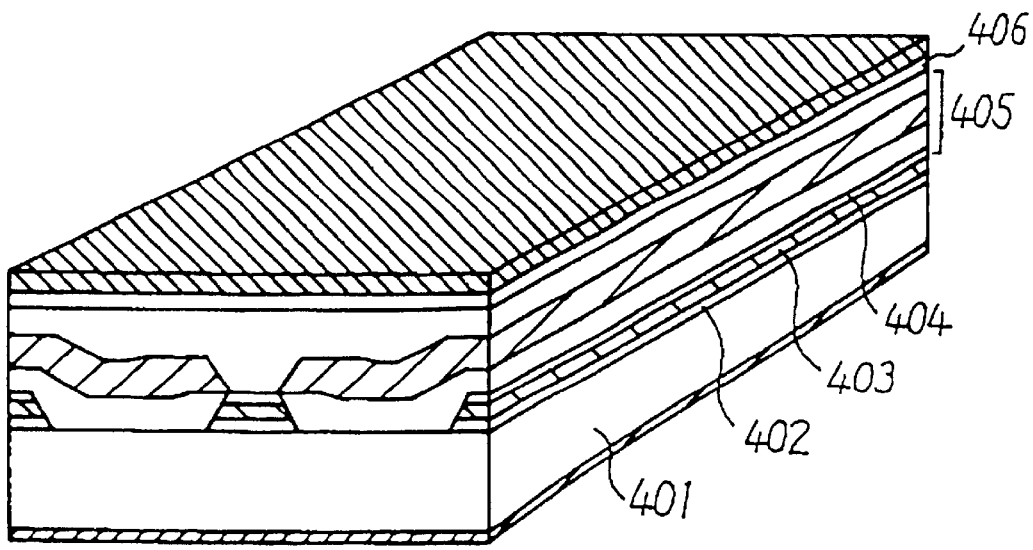
FIG. 2 shows another conventional semiconductor laser implemented by selective MOVPE.

FIG. 2 shows another conventional semiconductor laser which is produced by selective MOVPE. As shown, the laser includes a (100)n-InP substrate 401. A pair of $SiO_2$ (silicon dioxide) stripe masks are formed on the substrate 401 at an interval of 5 $\mu$m in a <011> direction. Then, an n-InP buffer layer 402, an active layer 403 formed of InGaAsP and having a multiple quantum well (MQW layer hereinafter) structure, and an active stripe implemented by a p-InP cladding layer 404 are formed by selective MOVPE. Subsequently, a current blocking layer 405 implemented as a p-InP/n-InP/p-InP layer and having a thyristor structure and a p+-InGaAs cap layer 406 are formed. This kind of laser configuration is disclosed in the Papers of 56th Japanese Science Lecture Meeting, 1995, 27p-ZA-7, p. 930.

The laser shown in FIG. 2 allows its $SiO_2$ stripe mask width to be modulated in order to change the band gap and/or thickness of the MQW layer. It is therefore possible to form waveguides each having a particular function by a single crystal growth. However, the problem is that the current blocking layer 405 cannot exhibit its expected function in a high temperature environment or on the injection of a large amount of current.

Figure 3A:
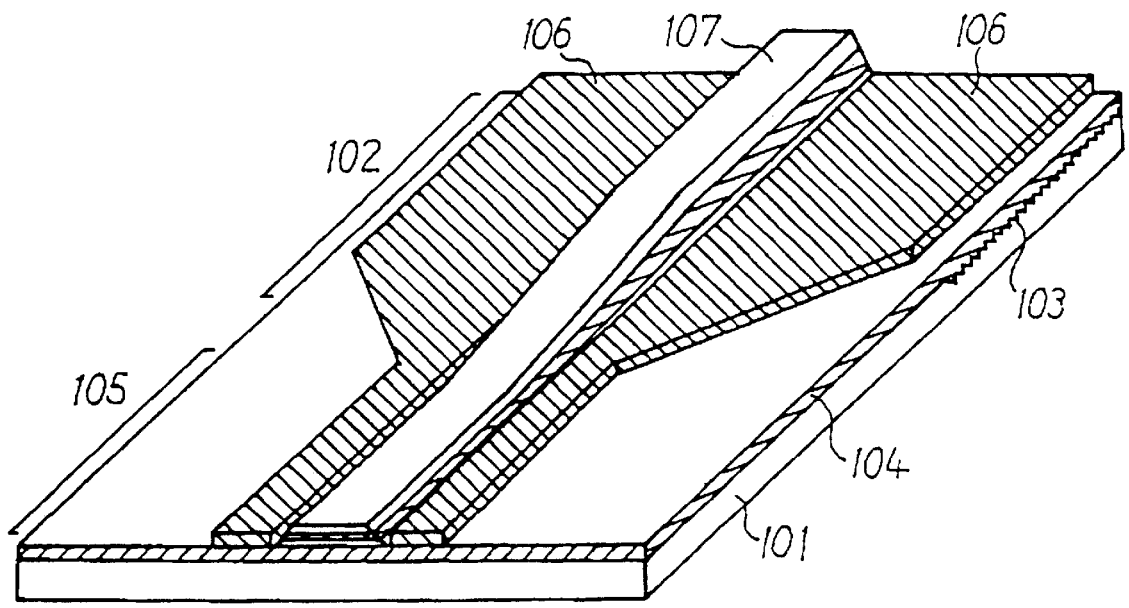
FIGS. 3A and 3B show a semiconductor laser embodying the present invention and implemented as a DFB laser including a semiconductor modulator integrally therewith.
Figure 3B:
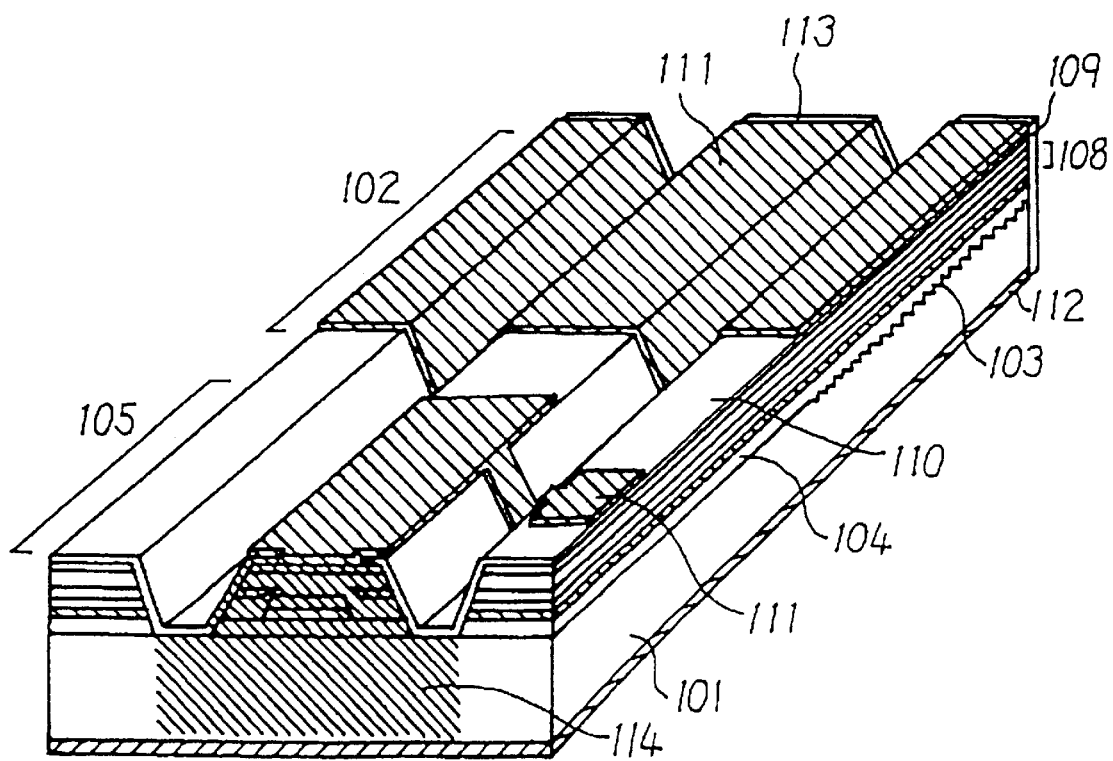

Referring to FIGS. 3A and 3B, a semiconductor device embodying the present invention is shown and implemented as a DFB laser having an integrated field electro type modulator integrally therewith by way of example. As shown, the DFB laser includes a (100) orientation n-InP substrate 101 having a laser portion 102 and a modulator portion 105. A procedure for producing the DFB laser will be described first. The laser portion 102 of the substrate 101 is formed with a corrugation 103 in a <011> direction by holographic exposure and wet etching. The corrugation 103 has a period of 241.7 nm. An InGaAsP layer 102 is formed on the laser portion 104, including the corrugation 103, by MOVPE at a pressure of 75 Torr and a temperature of 625° C. The InGaAsP layer 104 has a thickness of 0.1 $\mu$m, a carrier concentration of $5 \times 10^{17}$ $cm^{-3}$, and a band gap wavelength of 1.13 $\mu$m. Anti-growth masks 106 are formed on the InGaAsP layer 104. Specifically, after $SiO_2$ has been deposited on the InGaAsP layer 104 in a 150 nm thick layer by thermal CVD, the $SiO_2$ layer is patterned by conventional photolithography and wet etching in order to form the anti-growth masks 106 in the <011> direction. The masks 106 are spaced by 1.5 $\mu$m, and each is 18 $\mu$m wide and 500 $\mu$m long in the laser portion 102 and 5 $\mu$m wide and 200 $\mu$m long in the modulator portion 105.

Subsequently, an eight-period MQW active layer, an InGaAsP light confining layer and a p-InP cladding layer are sequentially formed by selective MOVPE at a pressure of 75 Torr and a temperature of 625° C. in order to form a waveguide mesa 107. The MQW active layer is made up of a 6 nm thick 0.5% compressively strained InGaAsP well layer and an 8 nm thick barrier layer having a band gap wavelength of 1.13 $\mu$m. The InGaAsP light confining layer is 60 nm thick and has a carrier content of $5 \times 10^{17}$ $cm^{-3}$ and a band gap wavelength of 1.13 $\mu$m. The p-Inp cladding layer is 0.1 $\mu$m thick and has a carrier concentration of $5 \times 10^{17}$ $cm^{-3}$. As a result, the waveguide mesa 107 is formed such that it has a band gap wavelength composition of 1.56 $\mu$m in the laser portion 102.

At this instant, the MQW layer in the modulator portion 105 has a band gap wavelength of 1.47 $\mu$m. After the anti-growth masks 106 have been removed, $SiO_2$ is deposited on the entire wafer to a thickness of 300 nm in the form of mesas. Then, the $SiO_2$ layer is processed by photolithography and wet etching to turn out an $SiO_2$ pattern.

Thereafter, a 0.3 $\mu$m thick p-InP layer having a carrier concentration of $5 \times 10^{17}$ $cm^{-3}$, a 1 $\mu$m thick n-InP layer having a carrier concentration of $1 \times 10^{18}$ $cm^{-3}$, and a 0.2 $\mu$m thick p-InP layer having a carrier concentration of $5 \times 10^{17}$ $cm^{-3}$ are sequentially formed by selective MOVPE at a pressure of 75 Torr and a temperature of 625° C. After the $SiO_2$ mask has been removed, a 1.5 $\mu$m thick p-InP layer having a carrier concentration of $1 \times 10^{18}$ $cm^{-3}$ is formed by MOVPE at a pressure of 75 Torr and a temperature of 625° C. in order to form a current blocking layer 108 having a thyristor structure. A 0.2 $\mu$m thick InGaAs cap layer 109 having a carrier concentration of $5 \times 10^{18}$ $cm^{-3}$ is formed on the current blocking layer 108.

After 10 $\mu$m wide mesa stripes have been formed by wet etching, $SiO_2$ 110 is deposited to a thickness of 350 nm and then subjected to conventional photolithography and wet etching in order to form contact holes. Then, Ti and Au are respectively deposited to a thickness of 100 nm and a thickness of 300 nm by sputtering and then subjected to conventional photolithography and wet etching so as to form p-electrodes or pads 111 in the modulator portion 105 and laser portion 102. After the wafer with such a configuration has been ground to a thickness of 100 $\mu$m, Ti and Au are respectively deposited on the rear of the wafer to a thickness of 100 nm and a thickness of 300 nm by sputtering in order to form an n-electrode 112. The wafer undergone the above procedure is sintered in an $N_2$ atmosphere.

Finally, the wafer is cleaved at the center between the laser portion 102 and the modulator portion 105. A reflection film 113 whose reflectance is as high as 90% and a reflection film 114 whose reflectance is as low as 0.1% are respectively formed on the end face of the laser side and the end face of the modulator side.

The laser produced by the above procedure was found to implement an optical output of 50 mW, which is double the conventional optical output, at drive thresholds of 8 mA and 200 mA. Further, when a reverse bias voltage of 2 V is applied to the modulator, an extinction ratio of higher than 15 dB was attained. Moreover, a penalty of less than 1 dB was achieved as a result of a transmission test using a modulation rate of 2.5 Gb/s and a 150 km long normal fiber.

Figure 4A:
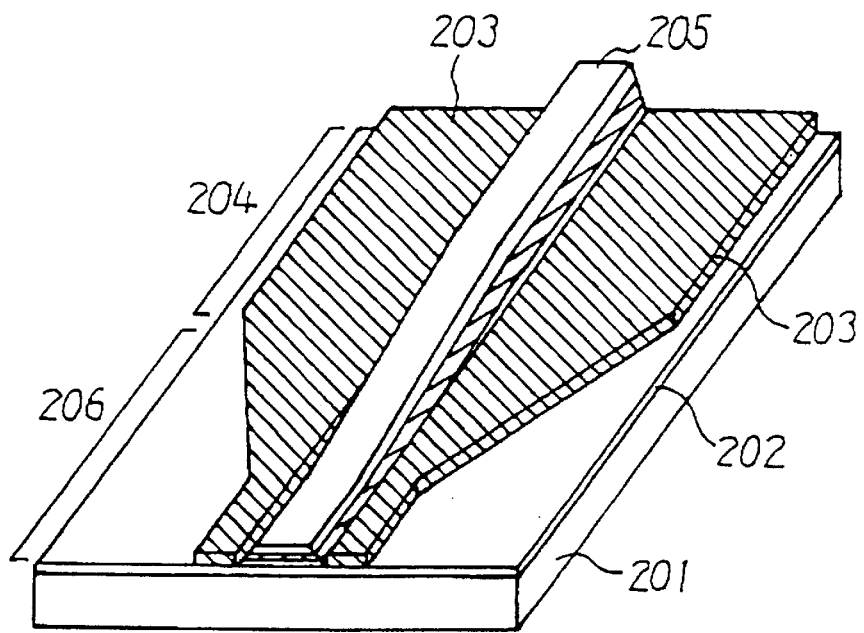
FIGS. 4A and 4B show an alternative embodiment of the present invention and implemented as an integrated semiconductor laser including a spot size converting portion.
Figure 4B:
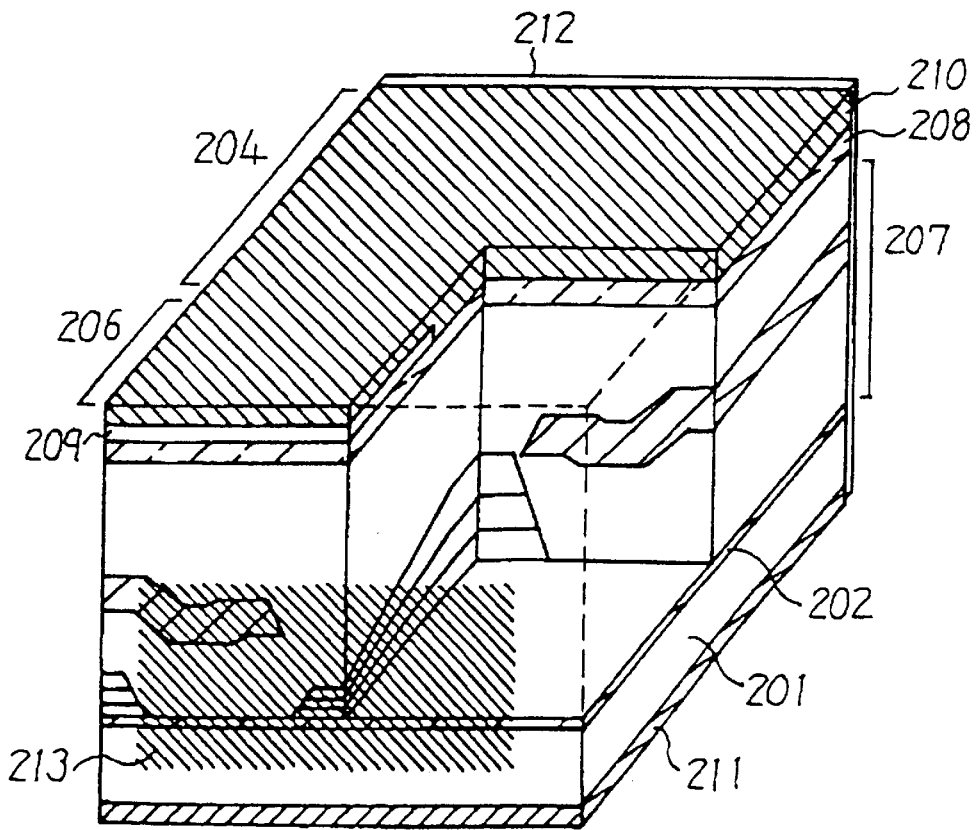

An alternative embodiment of the present invention will be described with reference to FIGS. 4A and 4B. This embodiment is implemented as a semiconductor laser with a spot size converting portion. As shown, the laser includes a (100) orientation n-InP substrate 201. How the laser is produced will be described first. A 60 nm thick InGaAsP layer 202 whose carrier content is $5 \times 10^{17}$ cm$^{-3}$ and band gap wavelength is 1.05 μm is formed on the substrate 201 by MOVPE at a pressure of 75 Torr and a temperature of 625° C. After SiO$_2$ has been deposited to a thickness of 150 nm by thermal CVD, it is subjected to conventional photolithography and wet etching in the <011> direction in order to form anti-growth masks 203. The anti-growth masks 203 are spaced by 1.5 μm, and each is 60 μm wide and 300 μm long in a laser portion 204 and 50 μm to 5 μm wide and 200 μm long in a spot size converting portion 206; the width in the portion 206 gradually varies in the above range.

Subsequently, a seven-period MQW active layer, an InGaAsP light confining layer and a p-InP cladding layer are sequentially formed by selective MOVPE at a pressure of 75 Torr and a temperature of 625° C. in order to form a waveguide mesa 205. The MQW active layer is made up of a 4 nm thick 1% compressively strained InGaAsP well layer and an 8 nm thick barrier layer having a band gap wavelength of 1.13 μm. The InGaAsP light confining layer is 60 nm thick and has a carrier concentration of $5 \times 10^{17}$ cm$^{-3}$ and a band gap wavelength of 1.13 μm. The p-InP cladding layer is 0.1 μm thick and has a carrier concentration of $5 \times 10^{17}$ cm$^{-3}$. As a result, the waveguide mesa 205 is formed such that it has a band gap wavelength composition of 1.3 μm in the laser portion 204. At this instant, each layer is gently reduced in thickness to about one-third.

SiO$_2$ is deposited on the entire wafer to a thickness of 300 nm in the form of mesas. Then, the SiO$_2$ layer is processed by photolithography and wet etching to turn out an SiO$_2$ pattern. Thereafter, a 0.3 μm thick p-InP layer having a carrier concentration of $5 \times 10^{17}$ cm$^{-3}$, a 1 μm thick n-InP layer having a carrier concentration of $1 \times 10^{18}$ cm$^{-3}$, and a 0.2 μm thick p-InP layer having a carrier concentration of $5 \times 10^{17}$ cm$^{-3}$ are sequentially formed by selective MOVPE at a pressure of 75 Torr and a temperature of 625° C. After the SiO$_2$ mask has been removed, a 4 μm thick p-InP layer having a carrier content of $1 \times 10^{18}$ cm$^{-3}$ is formed by MOVPE at a pressure of 75 Torr and a temperature of 625° C. in order to form a current blocking layer 207 having a thyristor structure. A 0.2 μm thick InGaAs cap layer 208 having a carrier content of $5 \times 10^{18}$ cm$^{-3}$ is formed on the current blocking layer 207.

Thereafter, SiO$_2$ is deposited to a thickness of 350 nm and then subjected to conventional photolithography and wet etching in order to form contact holes. Then, Ti and Au are respectively deposited to a thickness of 100 nm and a thickness of 300 nm by sputtering and then subjected to conventional photolithography and wet etching so as to form p-electrodes or pads 210. After the wafer with such a configuration has been ground to a thickness of 100 μm, Ti and Au are respectively deposited on the rear of the wafer to a thickness of 100 nm and a thickness of 300 nm by sputtering in order to form an n-electrode 211. The wafer undergone the above procedure is sintered in an N$_2$ atmosphere.

Finally, the wafer is cleaved at the center between the laser portion 204 and the spot size converting portion 206. A reflection film 212 whose reflectance is as high as 95% and a reflection film 213 whose reflectance is as low as 30% are respectively formed on the end face of the laser side and the end face of the spot size conversion side.

For a drive threshold of 6 mA and an optical output of 20 mW at room temperature, the illustrative embodiment was successful to drive the laser with a drive current of 40 mA. Particularly, at a temperature of 85° C. and for an oscillation threshold of 15 mA and an optical output of 20 mW, the illustrative embodiment reduced the drive current to 75 mA which was more than 30% lower than the conventional drive current. Further, the laser emitted light with a radiation angle of 13°×13°, i.e., it achieved a desirable spot size conversion characteristic.

In summary, in accordance with the present invention, waveguide layers each having a particular layer thickness and a particular composition can be collectively formed by selective MOVPE. This allows integrated semiconductor lasers feasible for high temperature operation or high output operation to be produced at a high yield. Specifically, although an SiO$_2$ stripe mask width is modulated at the time of MOVPE in order to form the above waveguide layers, a current blocking layer capable of exhibiting a sufficient current blocking function without regard to the above width can be formed.

Various modifications will become possible for those skilled in the aft after receiving the teachings of the present disclosure without departing from the scope thereof.

What is claimed is:

1. A method of producing a semiconductor device, comprising the steps of:
    forming two SiO$_2$ stripes on an InP substrate formed with an InGaAsP layer
    forming a waveguide including a multiple quantum well active layer by selective MOVPE between said two stripes; and
    burying said waveguide in an InP current blocking layer, wherein said waveguide forming step comprises the steps of:
    forming one of a seven-period and an eight-period MQW active layer on said in InGaAsP layer that is disposed between said two stripes;
    forming an InGaAsP light confining layer on eight-period MQW active layer; and
    forming a p-InP cladding layer on said InGaAsP light confining layer.

2. A method as claimed in claim 1, wherein said two stripes each has a width modulated in a direction of said waveguide.

3. A method as claimed in claim 1, wherein said waveguide forming steps are performed at a pressure of around 75 Torr and a temperature of around 625 degrees C.

4. A method as claimed in claim 1, wherein said MQW active layer includes a 0.5% compressively strained InGaAsP well layer and a barrier layer, said barrier layer being of a greater thickness than said 0.5% compressively strained InGaAsP well layer.

5. A method as claimed in claim 4, wherein said barrier layer has a band gap wavelength of 1.13 um.

6. A method as claimed in claim 5, wherein said InGaAsP light confining layer has a carrier content of $5\times10^{17}$ cm$^{-3}$.

7. A method as claimed in claim 6, wherein said InGaAsP light confining layer has a band gap wavelength of 1.13 um.

8. A method as claimed in claim 7, wherein said p-InP cladding layer has a carrier concentration of $5\times10^{17}$ cm$^{-3}$.

9. A method as claimed in claim 8, wherein said two stripes have a first width in a modulator portion of said semiconductor device, and have a second width in a laser portion of said semiconductor device, wherein said first width is less than said second width, and wherein a band gap wavelength composition of said waveguide in said laser portion is 1.56 um and a band gap wavelength composition of said waveguide in said modulator portion is 1.47 um.

10. A method as claimed in claim 2, wherein said two stripes have a first width in a modulator portion of said semiconductor device, and have a second width in a laser portion of said semiconductor device, wherein said first width is less than said second width, and wherein a band gap wavelength composition of said waveguide in said laser portion is 1.56 um and a band gap wavelength composition of said waveguide of said wavelength in said modulator portion is 1.47 um.

11. A method as claimed in claim 1, further comprising the step of:

forming pads by depositing Ti and Au on a top surface of said semiconductor device on which said waveguide and said two stripes are formed, wherein said pads correspond to p-electrodes.

12. A method as claimed in claim 11, further comprising the step of:

forming second pads by depositing Ti and Au on a bottom surface of said semiconductor device, wherein said second pads correspond to n-electrodes.

13. A method as claimed in claim 12, further comprising the steps of:

cleaving the top surface of said semiconductor device between the laser portion and the modulator portion;

forming a first reflection film having a reflectance as high as 90% on said cleaved top surface; and forming a second reflection film having a reflectance as low as 0.1% on an end face of the laser portion and on an end face of the modulator portion.

* * * * *